United States Patent [19]

Kahng et al.

[11] 4,271,583

[45] Jun. 9, 1981

[54] FABRICATION OF SEMICONDUCTOR DEVICES HAVING PLANAR RECESSED OXIDE ISOLATION REGION

[75] Inventors: Dawon Kahng, Bridgewater Township, Somerset County; Theodore A. Shankoff, Mendham, both of N.J.

[73] Assignee: Bell Telephone Laboratories, Incorporated, Murray Hill, N.J.

[21] Appl. No.: 128,841

[22] Filed: Mar. 10, 1980

[51] Int. Cl.³ .......................................... H01L 21/302
[52] U.S. Cl. ...................................... 29/571; 148/1.5; 148/187
[58] Field of Search ................... 148/187, 1.5; 29/571

[56] References Cited

U.S. PATENT DOCUMENTS

| | | | |
|---|---|---|---|
| 3,761,327 | 9/1973 | Harlow et al. | 148/187 |
| 3,958,040 | 5/1976 | Webb | 427/94 |
| 4,002,511 | 1/1977 | Magdo et al. | 148/187 |
| 4,088,516 | 5/1978 | Kondo et al. | 148/187 |
| 4,209,349 | 6/1980 | Ho et al. | 148/187 |
| 4,219,369 | 8/1980 | Ogiue et al. | 148/1.5 |

OTHER PUBLICATIONS

Cosand et al., Extended Abstracts, Electrochem. Soc., Spring Meeting, Wn. D.C. (1976), pp. 292 and 293.

*Primary Examiner*—G. Ozaki
*Attorney, Agent, or Firm*—David I. Caplan

[57] ABSTRACT

In the fabrication of semiconductor integrated circuits which include recessed oxide isolation regions (29), formation of the undesired "bird's head" and "bird's beak" is avoided by reducing the rate of oxide growth from the sidewalls of isotropically etched recesses (22) while oxide is being grown from the bottoms of the recess regions. A silicon nitride mask (24) formed selectively on each of the sidewalls which has previously been coated with a thin silicon dioxide layer (23) reduces the rate of oxide growth therefrom, so that the oxidized recess regions have substantially planar surfaces after termination of the oxide growth.

11 Claims, 5 Drawing Figures

FABRICATION OF SEMICONDUCTOR DEVICES HAVING PLANAR RECESSED OXIDE ISOLATION REGION

FIELD OF THE INVENTION

This invention relates to semiconductor circuit devices integrated in a semiconductive silicon body having recessed regions of dielectric oxide for electrically isolating different circuit portions.

BACKGROUND OF THE INVENTION

Semiconductor integrated circuit apparatus in current technology are often fabricated by forming recesses at the major surface of a semiconductive silicon body and then filling the recesses with silicon dioxide by selective oxidation, typically using silicon nitride films as masks; thereby, recessed oxide isolation zones or regions are created for the purpose of electrically isolating different circuit portions. In the ordinary thermal oxide growth processes for filling recesses with oxide, however, undesirable structures are produced at the edge of the recess, recognized in the prior art as the "bird's beak" and "bird's head" or crest. This problem is described, for example, in "Topology of Silicon Structures with Recessed SiO$_2$" by E. Bassous, H. N. Yu and V. Maniscalco, *J. Electrochem. Soc.*, Nov. 1976, Vol. 123, No. 11, pages 1729–1737, and in U.S. Pat. No. 4,002,511 to Magdo et al.

More specifically, the above-cited reference of Magdo et al purposes a technique for reducing the "bird's beak" aspect of the problem by increasing the extent of the silicon nitride mask so that it contacts and covers a portion of the exposed silicon. However, because of the isotropic growth of the oxide from all surfaces of the recess, a protuberance or "bird's head" still forms in the peripheral surface of the recessed oxide isolation zone. Moreover, a "bird's beak" still may form to some extent, particularly where another oxide layer is present next to the silicon. Thus the integrated circuit device lacks the desired planarity; accordingly, the subsequent formation of overlayers of dielectric and conductive materials is rendered difficult and generally unsatisfactory.

In U.S. Pat. No. 3,958,040, issued to Webb on May 18, 1976, a technique for reducing the "bird-head" problem is disclosed in which the growth of silicon dioxide from the sidewalls of the recesses is inhibited by a masking layer of silicon nitride on these sidewalls, in order to enable the fabrication of a more smooth topology on the top surface of the resulting recess oxide. However, such a technique does not in practice result in a sufficiently smooth topology for satisfactory further device processing.

Accordingly, it would be desirable to have a method of fabricating semiconductor integrated circuits having recessed oxide isolation zones which are substantially planar and are free of any substantial surface proturberances.

SUMMARY OF THE INVENTION

This invention involves the fabrication of semiconductor circuits in a semiconductive silicon body comprising a process for forming an oxide isolation region (29) in the semiconductive silicon body (10) by thermal oxide growth in a recess region (22) therein while the rate of such growth on a sidewall of the recess region (22), as compared with growth on the bottom of said recess region (22), is reduced by a mask (24) on said sidewall, characterized in that said sidewall is coated with a thermally grown silicon dioxide layer (23) prior to the oxide growth in the recess region (22), said recess region (22) having been fabricated by substantially isotropic etching of a restricted portion of an originally substantially planar surface of the body (10). By "substantially isotropic" etching is meant that the etching rate is the same in all directions to within about ±10 percent.

In a particular embodiment in accordance with the invention, the entire sidewall portions of the recesses are first coated with silicon dioxide and then selectively masked with a silicon nitride film which, as is known, reduces the rate of oxide growth from the underlying silicon. One method of providing such a selective mask includes the step of depositing a film of silicon nitride over the entire surface of the semiconductor body after the recesses have been formed by isotropic etching. Then, in accordance with one particularly useful approach, straight-line etching techniques such as chemically reactive sputtering (reactive ion or plasma etching) or chemically non-reactive sputtering (non-reactive ion etching) can be used to remove entirely the silicon nitride on the bottom (but not sides) of the recesses; thereby the underlying silicon on the bottom of the recesses is exposed to the subsequent oxidation process. Accordingly, thermal oxide growth will then proceed unhindered from the bottom of the recesses, while relatively little growth occurs from the sidewalls, as desired in this invention.

BRIEF DESCRIPTION OF THE DRAWING

This invention and its other objects, features, and advantages will be more clearly understood from the following detailed description taken in conjunction with the drawing in which.

DETAILED DESCRIPTION

Figure 1:
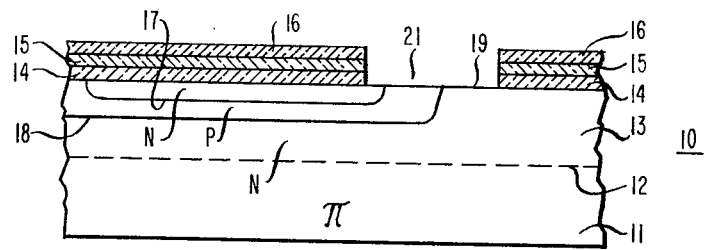
FIGS. 1 through 5 depict, in cross-section, a succession of views of a portion of a silicon semiconductor wafer in which an oxide isolation region is fabricated in accordance with this invention. Only for the sake of clarity, none of the drawings is to scale.

FIG. 1 shows a portion 10 of a single crystal silicon semiconductor body or wafer which has been formed by epitaxial growth from an original starting silicon layer 11. As is well known in the art, semiconductor devices generally are fabricated in large numbers as part of a relatively large, substantially circular wafer of semiconductor material, which finally is divided into individual devices commonly referred to as "chips". The description herein of the practice of this invention will relate only to a portion of a chip where an oxide isolation region is formed. It will be understood that the method steps described are applicable to an entire wafer from which a plurality of such chips are formed. Moreover, a detailed description of semiconductor device fabrication steps, such as impurity introduction by diffusion or ion implantation, processes of epitaxial growth (if any), masking methods, and material depositions, all of which are well known in the art, will not be included herein.

In one conventional form of semiconductor device, a monocrystalline silicon layer 13 is formed by epitaxial deposition on top of the starting silicon layer 11 and is usually of opposite conductivity type to that of the starting layer 11. For example, the layer 11 is semiintrinsic π type conductivity, while the layer 13 is moderately conductive N type; the interface between these two conductivity type zones is represented by the broken line 12. Then, by selective masking and impurity introduction methods known in the art, the PN junctions 17 and 18, defining the boundaries of zones of alternate conductivity type, are formed from the upper surface of the epitaxial layer 13. In general, a given recess oxide isolation zone 29 (FIG. 5) will be intersected at some portion of its boundary 28 by one or more such PN junctions, but not necessarily. As is known, the P and N zones as defined by the PN junctions represent portions of active devices which form elements of the integrated circuit, ordinarily all located at an originally planar major surface 19 of the body 10.

Figure 2:
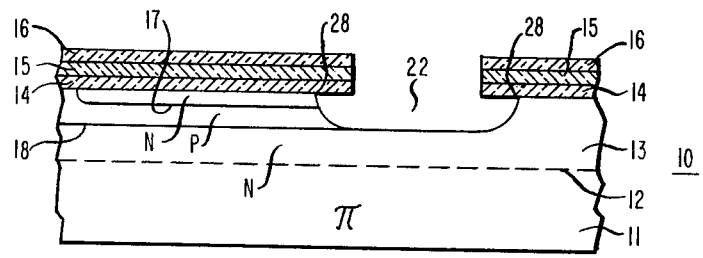

Next, a silicon dioxide layer 14 is formed by thermal oxidation over the entire surface of the wafer, and a silicon nitride layer 15 is formed by deposition on the silicon dioxide surface. The silicon dioxide layer 14 has a thickness ordinarily in the range of about 100 to 500 angstroms, typically 300 to 400 angstroms; and the silicon nitride layer 15 has a thickness typically of about 1200 to 2500 angstroms, preferably about 1500 to 1800 angstroms; that is, a thickness of nitride which is sufficient so that subsequent processing steps will not significantly affect the oxidation masking property of this nitride layer. Then, a second silicon dioxide layer 16, typically 1000 angstrom thick, is deposited over the silicon nitride layer 15. This oxide layer 16 is patterned with apertures at locations overlying the ultimately desired recess regions, typically using photoresist and hydrofluoric acid, which then enables patterning of the silicon nitride layer 15. Using successive etching solutions, namely, aqueous hot (typically about 160 to 180 degrees C.) phosphoric acid for etching the silicon nitride layer 15 and buffered hydrofluoric acid for etching the silicon dioxide layer 14, apertures 21 are formed through the layers 16, 15, and 14 to expose the silicon surface 19 (FIG. 1) at the location of the desired oxide isolation region. Advantageously, the second oxide layer 16 is sufficiently thicker than the first oxide layer 14 that a thickness of the second oxide layer 16 remains that is sufficient for protecting the nitride layer 15 during subsequent etching of silicon to form the recess region 22 (FIG. 2).

The body 10 is then treated with an isotropic etchant (for silicon) to form the recess region 22 (FIG. 2) defining the isolation zone. In those structures in which a PN junction then intersects the recess region anywhere, it is important that the etchant be selected such that it is substantially isotropic even in the presence of the PN junctions at the boundaries of conductivity zones ordinarily otherwise characterized by substantially different etching rates in P vs. N type silicon unless a restricted class of etchants be used. On the other hand, if there is no PN junction then present at the recess region, a wider class of etchants can be used, namely those etchants which do not prefer to any substantial degree any crystallographic direction in the semiconductor layer 13. One specifically useful etchant technique for this purpose, particularly in the presence of a PN junction at the recess region, is a gaseous etchant, the reactive agent being atomic fluorine, as described, for example, in a paper by D. L. Flamm entitled "Measurements and Mechanisms of Etchant Production During the Plasma Oxidation of CF$_4$ and C$_2$F$_6$" published in *Solid State Technology*, Vol. 22, No. 4, pp. 109–116 (April, 1979).

Another substantially isotropic etchant technique particularly useful in the absence of a PN junction at the recess region is, for example, etching with a solution containing a relatively low concentration of chromium trioxide in aqueous hydrofluoric acid—such as a aqueous solution comprising about 10 percent by weight of hydrofluoric acid, about 1 percent by weight of chromium trioxide—which is applied at a temperature of about 23 degrees C. In any event, because this etching process is substantially isotropic, the etching boundary advances substantially equally on all exposed surfaces which are quarter circles having radii centered at the lower apex of the overhanging portions of the oxide-nitride mask formed by layers 14 and 15. The mask is thus undercut to the boundary line 28 of the recess region 22.

As is known in the art, the silicon oxide growth process to be carried out in the recess region produces approximately 2.3 times the volume of oxide as that of the silicon which is consumed. Accordingly, recesses are etched to approximately 56 percent the depth of the ultimately desired oxide isolation region adjusted for the thickness of recess oxide to be removed off its top, as explained below. For a final oxide depth of one mircon, for example, the silicon is etched to a depth of about 5540 angstroms as explained more fully below. In the structure depicted herein, it is desired that the oxide isolation zones ultimately reach through to the epitaxial layer 13, and recesses are formed sufficiently deep to that end by using a sufficient etching time for the recess formation.

Figure 3:
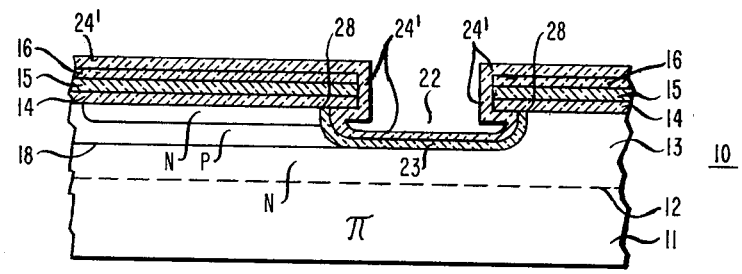
Figure 4:
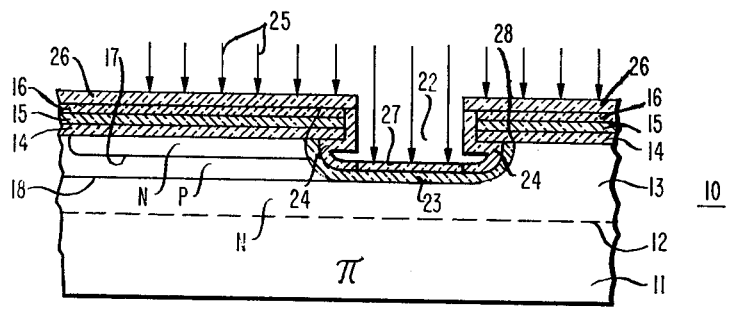

As indicated in FIG. 3, the exposed silicon in the recess is coated, by means of a dry thermal oxide growth step, with a thin layer 23 of silicon dioxide, typically about 100 angstroms in thickness for an oxide isolation region 29 (FIG. 5) which is to be about 10,000 angstroms deep. It is preferred that this oxide layer 23 coats the entire sidewall portions of the recess region 22; so that, during the subsequent growth of the oxide isolation region, only some limited oxide growth simultaneously proceeds, with the slight aid of the thin oxide layer 23, up the sidewalls of the oxide isolation region under the nitride mask 24 (FIG. 4). Then, as further indicated in FIG. 3, the entire top face of the semiconductor wafer is subjected to a deposition process to form a thin film 24' of silicon nitride.

A convenient and well-known technique for depositing silicon nitride (layer 15 or 24') is by means of chemical vapor deposition using the reaction at an elevated temperature of silicon hydride and ammonia. An illustrative process for the chemical vapor deposition process of silicon nitride uses the pyrolytic reaction 17 cc/min. of silane (SiH$_4$) flowing at a rate of 17 cc/min., ammonia (NH$_3$) flowing at a rate of 3 liters per minute, in a carrier gas such as nitrogen at a temperature in the range of about 600 to 850 degrees C. A typical deposition rate is 200 angstroms per minute.

The chosen thickness of the nitride film 24', is related directly to the duration of the oxidation process and thus indirectly to the ultimate depth of the oxide isolation region. The portions of the nitride film 24 (FIG. 4) which mask the sidewalls of the recess, particularly at the upper end at the device surface, should not be consumed during the subsequent isolation region oxide growth process. Specifically, it has been found that for an oxide isolation region ultimately of a depth of one micron (10,000 angstroms), a nitride film 24' having a thickness of about 500 angstroms is satisfactory; for an isolation oxide depth of two microns, a nitride film thickness of about 800 angstroms is satisfactory.

As depicted in FIG. 4 by the arrow headed lines 25, in order to remove unwanted silicon nitride, the surface of the wafer is next subjected to an anisotropic, straight-line sputter etching step, such as bombardment with a parellel beam of argon ions. By "straight-line" etching is meant that only those top portions 26 and bottom portions 27 of the nitride layer 24' are removed which are within the (vertical) lines 25 of the bombardment direction and not these portions 24 in the shadow cast by the overhang of the layers 14 and 15. For example, argon gas at a pressure of about 10 micron Hg, with as much as about 20 percent oxygen for passivating only aluminum arising from the electrodes or the sidewalls of the container, can be used in a discharge having a dark space voltage drop of about 2 kilovolt at a power density level of about 1 watt/cm$^2$ and RF frequency of about 13.56 MHz.

In another, nonpreferred alternative process for removal of unwanted silicon nitride, the surface of the wafer is subjected to a straight-line ion implantation with a parallel beam of oxygen atoms. This implantation is a comparatively low energy shallow implantation designed only to affect the surface film 24'. A dose of about $2 \times 10^{17}$ atoms/cm$^2$ at about 15 KeV produces an oxygen concentration of about 10 percent in the exposed nitride layer. The estimated oxygen penetration is 250 angstroms. In particular, in addition to implanting oxygen in the film 24' on the top surface of the wafer, the process effectively implants oxygen into only the bottom surface film portion 27 and the top surface film portion 26, leaving unaffected the sidewall film portions 24 which are protected by the resulting overhang of the oxide-nitride mask. The portions of the nitride layer thus exposed and implanted with oxygen are sputtered off to a depth of about 200 to 250 angstroms; the remaining nitride is thereby converted to a silicon oxynitride material which does not inhibit thermal oxidation but which oxidizes under the thermal treatment at about the same rate as the underlying silicon.

Next, the wafer 10 is subjected to a thermal oxidation process which may be carried out in several alternative ways, typically at temperatures in the range of 900 to 1100 degrees C. in the presence of an oxidizing atmosphere such as water vapor or pure oxygen or both. Also, it has been found advantageous in certain situations to perform this thermal oxidation at an elevated pressure which accelerates the process and thus enables use of lower temperatures. The silicon adjoining the recess is thereby converted to an oxide, starting with the bottom surface of the recess initially and moving upward and sideways as the silicon underlying the oxide layer 23 along the sidewalls of the recess 22 also slowly oxidizes. This thermal oxide growth in the recess region 22 is continued until the resulting grown oxide in the recess reaches a thickness of about 11,200 angstroms in the illustrative example where a final isolation oxide thickness of 10,000 angstroms is desired.

Because of a tendency for the resulting grown recess oxide to extend itself sideways undesirably into future transistor device areas, it is desirable to remove this "excess" recess oxide on the side edges of the recess region. Typically, an etching of about 1150 angstroms of surface oxide insures such removal of excess recess oxide. A substantially planar overall top surface topology (FIG. 5), mutually formed by the top surface of remaining recess oxide and the top complementary surface of the epitaxial layer 13, is conveniently obtained by successively etching away the silicon dioxide layer 16, the nitride layer 15, the silicon dioxide layer 14, and a suitable thickness of the recess oxide (i.e., removal of all the "excess" oxide). Specifically, the nitride layer 15 can be removed by etching with hot (160 to 180 degrees C.) phosphoric acid; the silicon dioxide layer 14 can then be removed by etching with buffered hydrofluoric acid which then also etches the excess recess oxide.

Figure 5:
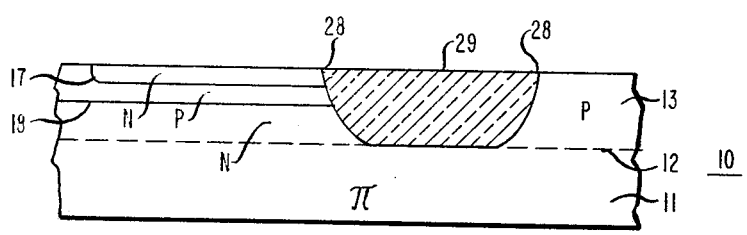

For example, the removal of the nitride layer 15 with hot phosphoric acid also entails the simultaneous removal of 5 angstroms per minute of etch time of silicon dioxide in the recess region. Typically, a total of 150 angstroms of such silicon dioxide is thus removed by the phosphoric acid during a 30 minute etch time for removal of 1500 angstrom of silicon nitride. Then, the removal of the silicon dioxide layer 14 with the hydrofluoric acid during a 30 second etch time also removes 500 angstroms off the top of the recess oxide; finally, an added 30 second etch time with the hydrofluoric acid removes an added 500 angstrom of recess oxide. Thus, for a 10,000 angstrom thick isolation oxide in the recess region, the recess depth should be $10,000-0.44\times(10,000+1150)=5094$ angstroms for achieving an overall planar topology. As indicated in FIG. 5, an oxide isolation region 29 is thus formed having a depth reaching at least to the boundary 12 of the epitaxial layer 13 and having a substantially planar top surface by virtue of the combination of the resulting reduced volume of silicon oxide generated from the masked sidewall portions of the recess with the subsequent etching of excess recess oxide.

Although the invention has been described in detail with reference to a specific embodiment, various modifications can be made without departing from the scope of the invention. For example, in addition to the reactive ion etching or oxygen implantation techniques described above for selectively affecting the silicon nitride mask 23, other techniques of plasma and sputter etching which have a straight-line effect when used at relatively low pressure, may be utilized to remove the masking film on the bottom of the recesses. Other selective removal techniques also may be devised which can accomplish the same purpose enabling those skilled in the art to practice the basic concept of this invention, namely, the reduced oxide growth from the sidewalls of the recess in which the isolation region is formed. Moreover, the thickness of the silicon dioxide layer 23 useful for the practice of the invention ordinarily can be in the range of about 50 angstroms to about 300 angstroms or more, depending upon the desired depth of the recess region 22.

We claim:

1. A method for fabricating semiconductor circuits in a semiconductive silicon body (10) comprising a process for forming an oxide isolation region (29) in the body (10) by thermal oxide growth in a recess region (22) in said body (10) while the rate of such growth on a sidewall of said recess region (22), as compared with growth on the bottom of said recess region (22), is reduced by a mask (24) on said sidewall, characterized in that said sidewall is coated with a thermally grown silicon dioxide layer (23) on which said mask (24) is formed prior to the oxide growth in the recess region (22), said recess region having been formed by substantially isotropic etching of a restricted portion of an originally substantially planar surface of the body (10).

2. The method recited in claim 1 in which the thickness of the silicon dioxide layer (23) is in the range of about 50 to 300 angstroms and in which the mask (24) is a layer of silicon nitride which covers an entire sidewall of said recess region (22).

3. The method recited in claim 1 in which the thickness of the silicon dioxide layer (23) is about 100 angstroms and in which the mask (24) is a layer of silicon nitride having a thickness in the range of about 500 to 800 angstroms.

4. The method of claim 1 in which the entire surface of said recess region (22) is covered with a masking material which effectively is removed from all but the said sidewall to form said mask (24).

5. The method recited in claim 4 in which the thickness of the silicon dioxide layer (23) is in the range of about 50 to 300 angstroms and in which the mask (24) is a layer of silicon nitride.

6. The method recited in claim 4 in which the thickness of the silicon dioxide layer (23) is about 100 angstroms and in which the mask (24) is a layer of silicon nitride having a thickness in the range of about 500 to 800 angstroms.

7. A method for manufacturing semiconductor devices having oxide isolation region (29) for electrically isolating different semiconductor circuit portions formed in a semiconductive silicon body (10) comprising the steps of:
(a) forming recess regions (22) in said body at an originally planar major surface thereof by means of substantially isotropic etching thereof;
(b) coating the sidewalls of said recess region (22) with a layer (23) of thermally grown silicon dioxide and a masking layer (24) on said thermally grown layer (23) which reduces the rate of thermal oxide growth from silicon, said masking layer (24); not coating the bottoms of said recess region (22); and
(c) thermally growing silicon dioxide to fill said recess regions (22).

8. The method of claim 7 in which said masking layer (24) is essentially silicon nitride and in which the thickness of the silicon dioxide layer (23) is in the range of about 50 to 300 Angstroms.

9. The method of claims 7 or 8 in which the material of said masking layer is first deposited over the entire surface of the recess regions (22) and is then selectively removed from the said bottoms thereof.

10. The method of claim 9 in which said removal includes the step of ion etching the masking layer material at said bottoms of the recess, using an overhanging film at the edges of the recess regions (22) as a shadow mask against said ion etching.

11. The method of claim 10 in which said ion etching is reactive ion etching.

* * * * *

UNITED STATES PATENT AND TRADEMARK OFFICE
CERTIFICATE OF CORRECTION

PATENT NO. : 4,271,583
DATED : June 9, 1981
INVENTOR(S) : Dawon Kahng and Theodore A. Shankoff It is certified that error appears in the above—identified patent and that said Letters Patent is hereby corrected as shown below:

Column 1, line 31, "purposes" should read --proposes--.
Column 4, lines 24-25, "mircon" should read --micron--.
Column 5, line 14, "only" should read --any--. Column 6, line 17, "angstrom" should read --angstroms--. Column 6, line 22, "angstrom" should read --angstroms--. Column 6, line 42, "pressure" should read --pressures--. Column 7, claim 7, line 28, "region" should read --regions--.

Signed and Sealed this

Twenty-ninth Day of September 1981

[SEAL]

Attest:

Attesting Officer

GERALD J. MOSSINGHOFF

Commissioner of Patents and Trademarks